United States Patent
Choi et al.

(10) Patent No.: US 7,332,764 B2
(45) Date of Patent: Feb. 19, 2008

(54) METAL-INSULATOR-METAL (MIM) CAPACITOR AND METHOD OF FABRICATING THE SAME

(75) Inventors: Seung-Man Choi, Hwaseong-si (KR); Ki-Chul Park, Suwon-si (KR); Bong-Seok Suh, Suwon-si (KR); Il-Ryong Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/080,567

(22) Filed: Mar. 16, 2005

(65) Prior Publication Data

US 2005/0275005 A1 Dec. 15, 2005

(30) Foreign Application Priority Data

Jun. 11, 2004 (KR) ...................... 10-2004-0043165

(51) Int. Cl.
*H01L 29/76* (2006.01)
(52) U.S. Cl. ........................ 257/300; 257/310; 257/296
(58) Field of Classification Search ........ 257/758–760, 257/300, 310, 296; 438/243
See application file for complete search history.

(56) References Cited

U.S. PATENT DOCUMENTS

| | | | |
|---|---|---|---|
| 5,798,559 A * | 8/1998 | Bothra et al. ............... | 257/522 |
| 6,413,815 B1 * | 7/2002 | Lai et al. ..................... | 438/243 |
| 6,472,721 B2 | 10/2002 | Ma et al. ..................... | 257/531 |
| 6,559,546 B1 * | 5/2003 | Achuthan et al. ........... | 257/758 |
| 6,686,662 B2 * | 2/2004 | Merchant et al. ........... | 257/751 |
| 2005/0006771 A1 * | 1/2005 | Akiyama ..................... | 257/758 |

FOREIGN PATENT DOCUMENTS

| JP | 11-274428 | 10/1999 |
|---|---|---|
| KR | 2004-0009749 | 1/2004 |

* cited by examiner

*Primary Examiner*—Mary Wilczewski
*Assistant Examiner*—Tsz Chiu
(74) *Attorney, Agent, or Firm*—Lee & Morse, P.C.

(57) ABSTRACT

In a MIM capacitor, and method of fabricating the same, the MIM capacitor includes an interlayer insulating layer on a semiconductor substrate, a lower metal interconnection and a lower metal electrode in the interlayer insulating layer, an intermetal dielectric layer covering the lower metal interconnection, the lower metal electrode, and the interlayer insulating layer, a via hole exposing the lower metal interconnection, an upper metal interconnection groove crossing over the via hole, at least one capacitor trench region exposing the lower metal electrode, an upper metal interconnection filling the upper metal interconnection groove, the upper metal interconnection being electrically connected to the lower metal interconnection through the via hole, a dielectric layer covering inner surfaces of the at least one capacitor trench region, and an upper metal electrode surrounded by the dielectric layer to fill the at least one capacitor trench region.

22 Claims, 5 Drawing Sheets

METAL-INSULATOR-METAL (MIM) CAPACITOR AND METHOD OF FABRICATING THE SAME

BACKGROUND OF THE INVENTION

1. Field of the Invention

The present invention relates to a semiconductor device and method of fabricating the same. More particularly, the present invention relates to a metal-insulator-metal (MIM) capacitor and method of fabricating the same.

2. Description of Related Art

Recently, a semiconductor device for implementing a capacitor with high capacity has been developed for analog circuits requiring high-speed operation. Typically, the capacitor is composed of overlapping upper and lower electrodes and a dielectric layer interposed therebetween. When the capacitor is formed in a polysilicon-insulator-polysilicon (PIP) structure, an oxidation reaction occurs at an interface between the polysilicon electrodes and the dielectric layer and further oxidation occurs due to a subsequent annealing process to change electrical characteristics of the capacitor. Further, the capacitor has non-uniform capacitance depending on a size of a voltage applied to the polysilicon electrodes. For example, when capacitor electrodes are doped with n-type impurities and a negative voltage is applied to the upper electrode, holes are induced to the surface of the lower electrode. Resultantly, a depletion layer may be formed on the surface of the lower electrode, the depletion layer having a width that varies depending on the size of the negative voltage applied. Due to the depletion layer, the capacitance of the capacitor is not uniform and varies depending on the size of the applied voltage. As a result, there are disadvantages in that such a capacitor is not suitable for a semiconductor device having an analog circuit due to the nonlinear characteristic of the capacitance.

A metal-insulator-metal (MIM) capacitor having metal electrodes has been proposed in an effort to solve the above-described problem associated with a polysilicon-insulator-polysilicon (PIP) capacitor. A MIM capacitor is mainly used for a high performance semiconductor device because of its small resistivity and absence of parasitic capacitance caused by internal depletion.

The manufacture of a high performance semiconductor device requires a metal interconnection having low electric resistance and high reliability. MIM capacitors using copper as a material of this metal interconnection have recently been proposed. However, because it is difficult to pattern copper using a reactive ion etching (RIE) method, the metal interconnection is typically formed by a damascene process.

One conventional method of fabricating a MIM capacitor includes forming a MIM capacitor by a dual damascene process. More specifically, in this conventional method, a lower copper interconnection layer and a lower electrode layer are formed within an insulating layer by a damascene process, and then a buffer layer and an inter-metal dielectric (IMD) layer are formed. Photolithography and etching processes are performed on the structure to form a trench that forms a capacitor region. A buffer layer and a dielectric layer are formed in the trench. The buffer layer is further formed on the dielectric layer, and then an etching process is performed to expose the lower copper interconnection through the photolithography and etching processes. A buffer layer is formed to protect the lower copper interconnection region. The lower copper interconnection region and the capacitor region are buried with metal and then are planarized to form a metal interconnection and an upper electrode.

In this method, however, there is still a disadvantage related to fabrication costs due to the photolithography process because a photolithography process for exposing the lower copper interconnection region must be performed in addition to a photolithography process for exposing the upper electrode region.

As a result, there is a need for a method of fabricating a MIM capacitor that is capable of reducing fabrication costs by reducing the number of required photolithography processes.

SUMMARY OF THE INVENTION

The present invention is therefore directed to a metal-insulator-metal (MIM) capacitor and method of fabricating the same, which substantially overcome one or more of the problems due to the limitations and disadvantages of the related art.

It is a feature of an embodiment of the present invention to provide a semiconductor device having a MIM capacitor that exhibits increased capacitance and improved reliability.

It is another feature of an embodiment of the present invention to provide a method of fabricating a MIM capacitor that is capable of reducing fabrication costs by reducing the number of required photolithography processes as compared to conventional fabrication.

It is still another feature of an embodiment of the present invention to provide a method of fabricating a MIM capacitor that improves the reliability of the device by preventing oxidation of the lower metal interconnection.

At least one of the above and other features and advantages of the present invention may be realized by providing a metal-insulator-metal (MIM) capacitor including an interlayer insulating layer on a semiconductor substrate, a lower metal interconnection and a lower metal electrode in the interlayer insulating layer and spaced apart from each other, a first capping layer on the lower metal interconnection and a second capping layer on the lower metal electrode, an intermetal dielectric layer covering the lower metal interconnection, the lower metal electrode, the first and second capping layers, and the interlayer insulating layer, a via hole extending through the intermetal dielectric layer, the via hole exposing the first capping layer on the lower metal interconnection, an upper metal interconnection groove in the intermetal dielectric layer and crossing over the via hole, at least one capacitor trench region extending through the intermetal dielectric layer, the at least one capacitor trench region exposing the second capping layer on the lower metal electrode, an upper metal interconnection filling the upper metal interconnection groove, the upper metal interconnection being electrically connected to the lower metal interconnection through the via hole, a dielectric layer covering inner surfaces of the at least one capacitor trench region, and an upper metal electrode surrounded by the dielectric layer to fill the at least one capacitor trench region.

The MIM capacitor may further include a thin metal layer covering inner surfaces of the at least one capacitor trench region and surrounding the dielectric layer.

Each of the first and second capping layers may be formed of one selected from the group consisting of a tungsten layer, a cobalt tungsten phosphide layer, and a cobalt tungsten boron layer.

At least one of the above and other features and advantages of the present invention may be realized by providing a metal-insulator-metal (MIM) capacitor including an interlayer insulating layer on a semiconductor substrate, a lower metal interconnection and a lower metal electrode in the interlayer insulating layer and spaced apart from each other, an intermetal dielectric layer covering the lower metal interconnection, the lower metal electrode, and the interlayer insulating layer, a via hole extending through the intermetal dielectric layer, the via hole exposing the lower metal interconnection, an upper metal interconnection groove disposed in the intermetal dielectric layer and crossing over the via hole, at least one capacitor trench region extending through the intermetal dielectric layer, the at least one capacitor trench region exposing the lower metal electrode, an upper metal interconnection filling the upper metal interconnection groove, the upper metal interconnection being electrically connected to the lower metal interconnection through the via hole, a thin metal layer covering inner surfaces of the at least one capacitor trench region, a dielectric layer covering inner surfaces of the thin metal layer, and an upper metal electrode surrounded by the dielectric layer to fill the at least one capacitor trench region.

Either MIM capacitor may further include a diffusion barrier layer covering inner surfaces of the interlayer insulating layer and surrounding the lower metal electrode and the lower metal interconnection. The diffusion barrier layer may be formed of one selected from the group consisting of Ti, Ta, W, TiN, TaN, WN, TiSiN, TaSiN, and WSiN.

The thin metal layer may be formed of one selected from the group consisting of Ti, Ta, W, TiN, TaN, WN, TiSiN, TaSiN, and WSiN.

Either MIM capacitor may further include a diffusion barrier layer covering inner surfaces of the dielectric layer, the via hole, and the metal interconnection groove and surrounding the upper metal interconnection and the upper metal electrode. The diffusion barrier layer may be formed of one selected from the group consisting of Ti, Ta, W, TiN, TaN, WN, TiSiN, TaSiN, and WSiN.

At least one of the above and other features and advantages of the present invention may be realized by providing a method of fabricating a metal-insulator-metal (MIM) capacitor including forming an interlayer insulating layer on a semiconductor substrate, forming a lower metal interconnection and a lower metal electrode in the interlayer insulating layer, forming an intermetal dielectric layer on the interlayer insulating layer, the lower metal interconnection, and the lower metal electrode, simultaneously forming a via hole and at least one capacitor trench region by patterning the intermetal dielectric layer, the via hole exposing the lower metal interconnection and the at least one capacitor trench region exposing the lower metal electrode, conformably forming a dielectric layer on inner surfaces of the via hole, on inner surfaces of the at least one capacitor trench region, and on the intermetal dielectric layer, forming a groove crossing over the via hole in the intermetal dielectric layer, filling the via hole, the groove, and the at least one capacitor trench region with a metal layer, and forming an upper metal interconnection and an upper metal electrode by planarizing the metal layer and the dielectric layer to expose an upper surface of the intermetal dielectric layer.

Forming the lower metal interconnection and the lower metal electrode may include forming a lower metal interconnection trench region and a lower metal electrode trench region in the interlayer insulating layer using photolithography and etching processes, depositing a metal layer to fill the lower metal interconnection trench region and the lower metal electrode trench region, and planarizing the metal layer to expose the upper surface of the interlayer insulating layer.

The method may further include forming a diffusion barrier layer covering inner surfaces of the interlayer insulating layer and surrounding the lower metal electrode and the lower metal interconnection.

The method may further include forming a first capping layer on the lower metal interconnection and a second capping layer on the lower metal electrode. Each of the first and second capping layers may be formed of one selected from the group consisting of a tungsten layer, a cobalt tungsten phosphide layer, and a cobalt tungsten boron layer. The cobalt tungsten phosphide layer and the cobalt tungsten boron layer may be formed by an electroless plating method.

The method may further include forming a thin metal layer covering inner surfaces of the at least one capacitor trench region and surrounding the dielectric layer. The thin metal layer may be formed of one selected from the group consisting of Ti, Ta, W, TiN, TaN, WN, TiSiN, TaSiN, and WSiN.

Forming the groove may include forming a photoresist pattern having an opening crossing over the via hole on the intermetal dielectric layer, etching the intermetal dielectric layer to a predetermined depth using the photoresist pattern as an etch mask, and removing the photoresist pattern used as the etch mask. Removing the photoresist pattern may be performed by any one selected from the group consisting of an ashing method and a wet etching process using an organic striper.

The method may further include forming a sacrificial oxide layer on the dielectric layer. The sacrificial oxide layer may be formed of a material having high etch selectivity with respect to the dielectric layer.

The upper metal interconnection and the upper metal electrode may be formed by any one selected from the group consisting of a chemical vapor deposition method, an electroplating method, and an electroless plating method.

The method may further include forming a diffusion barrier layer covering the via hole, the metal interconnection groove, and the upper metal electrode. The diffusion barrier layer may be formed of one selected from the group consisting of Ti, Ta, W, TiN, TaN, WN, TiSiN, TaSiN, and WSiN.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
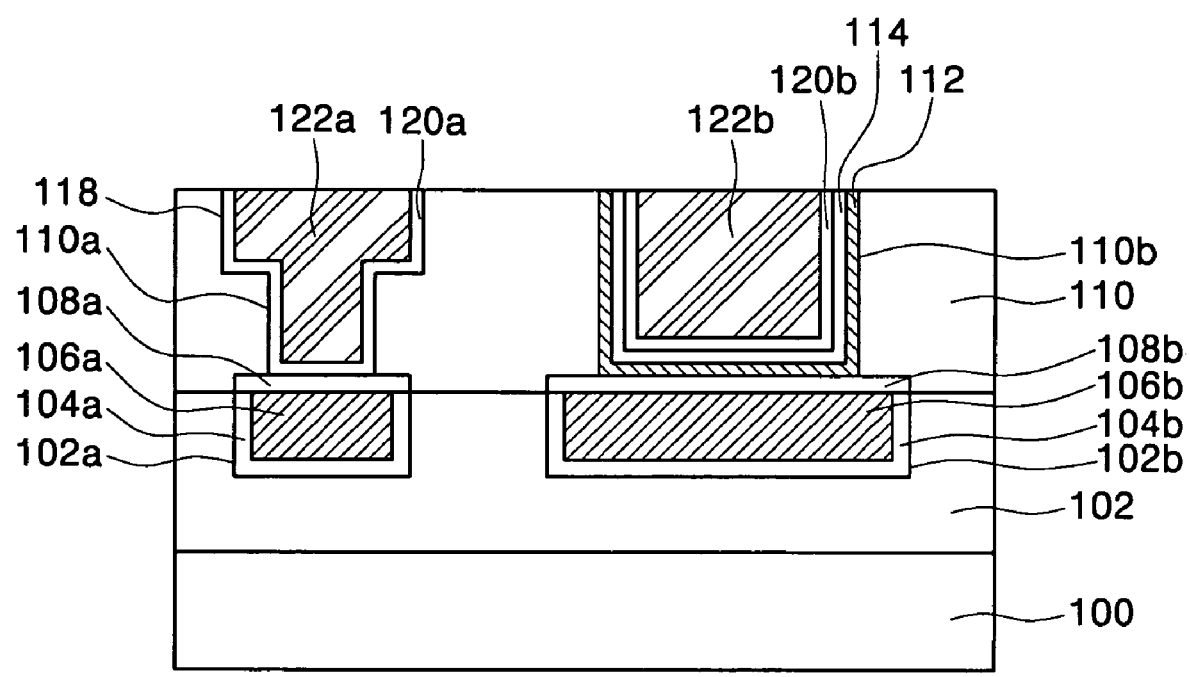
FIG. 1 illustrates a cross-sectional view of a MIM capacitor according to an embodiment of the present invention.

Korean Patent Application No. 2004-43165, filed on Jun. 11, 2004, in the Korean Intellectual Property Office, and entitled: "Metal-Insulator-Metal (MIM) Capacitor and Method of Fabricating the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of films, layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a cross-sectional view of a MIM capacitor according to an embodiment of the present invention.

Referring to FIG. 1, an interlayer insulating layer 102 is disposed on a semiconductor substrate 100. A lower metal interconnection trench region 102a and a lower metal electrode trench region 102b are disposed in the interlayer insulating layer 102 and are spaced apart from each other. A first diffusion barrier layer pattern 104a that covers the lower metal interconnection trench region 102a and a lower metal interconnection 106a surrounded by the first diffusion barrier layer pattern 104a are disposed in the lower metal interconnection trench region 102a. A second diffusion barrier layer pattern 104b that covers the lower metal electrode trench region 102b and a lower metal electrode 106b surrounded by the second diffusion barrier layer pattern 104b are disposed in the lower metal electrode trench region 102b. First and second capping layers 108a and 108b are disposed on the lower metal interconnection 106a and the lower metal electrode 106b, respectively. The first and second capping layers 108a and 108b are optional and may be omitted.

An intermetal dielectric layer 110 is formed on and covers the lower metal interconnection 106a, the lower metal electrode 106b, the first and second capping layers 108a and 108b (if present), and the interlayer insulating layer 102. The intermetal dielectric layer 110 includes a via hole 110a, a metal interconnection groove 118, and at least one capacitor trench region 110b. The via hole 110a extends through the intermetal dielectric layer 110 and exposes the lower metal interconnection 106a, or the first capping layer 108a, if present. The metal interconnection groove 118 is disposed in the intermetal dielectric layer 110 and crosses over the via hole 110a. A third diffusion barrier layer pattern 120a covers inner surfaces of the via hole 110a and the metal interconnection groove 118. An upper metal interconnection 122a surrounded by the third diffusion barrier layer pattern 120a fills the via hole 110a and the metal interconnection groove 118.

The capacitor trench region 110b extends through the intermetal dielectric layer 110 and exposes the lower metal electrode 106b, or the second capping layer 108b, if present. A thin metal layer 112 may cover inner surfaces of the capacitor trench region 110b. A dielectric layer 114 may cover the thin metal layer 112. A fourth diffusion barrier layer pattern 120b covers inner surfaces of the dielectric layer 114. An upper metal electrode 122b surrounded by the fourth diffusion barrier layer pattern 120b fills the capacitor trench region 110b.

A method of fabricating a MIM capacitor will now be described with reference to FIGS. 2A through 2G, which illustrate cross-sectional views of sequential stages in a method of fabricating a MIM capacitor according to an embodiment of the present invention.

Figure 2A:
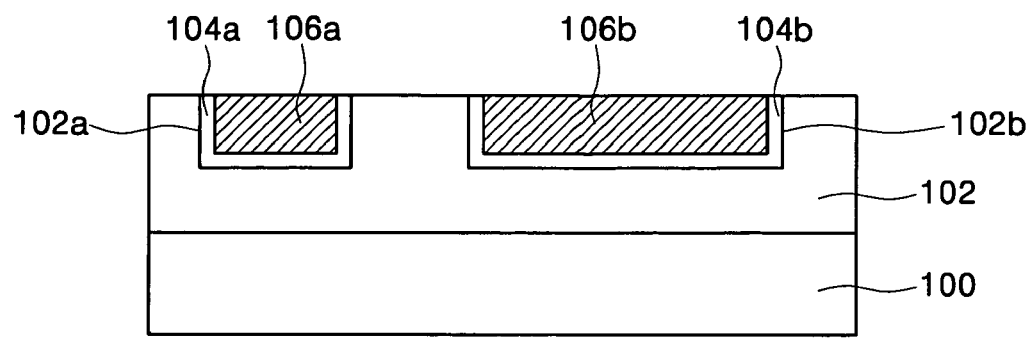
FIGS. 2A through 2G illustrate cross-sectional views of sequential stages in a method of fabricating a MIM capacitor according to an embodiment of the present invention.

Referring to FIG. 2A, the interlayer insulating layer 102 is formed on the semiconductor substrate 100. The interlayer insulating layer 102 is patterned by photolithography and etching processes to form the lower metal interconnection trench region 102a and at least one lower metal electrode trench region 102b. At this time, it is possible to increase the capacitance of the capacitor by forming a plurality of lower metal electrode trench regions 102b. A lower metal layer is then formed on the semiconductor substrate 100 having the trench regions 102a and 102b to fill the trench regions 102a and 102b. A highly reliable metal layer, e.g., a copper layer, may be used as the lower metal layer. A diffusion barrier layer may be conformably formed on inner surfaces of the trench regions 102a and 102b before forming the lower metal layer. The diffusion barrier layer may be formed of one selected from the group consisting of titanium (Ti) layer, a tantalum (Ta) layer, and a tungsten (W) layer. Alternatively, the diffusion barrier layer may be formed of a nitride layer including one selected from the titanium (Ti) layer, the tantalum (Ta) layer, and the tungsten (W) layer, e.g., a titanium nitride (TiN) layer, a tantalum nitride (TaN) layer, or a tungsten nitride (WN) layer. As a further alternative, the diffusion barrier layer may be formed of a three-member nitride layer containing titanium (Ti), tantalum (Ta) or tungsten (W), e.g., a titanium silicon nitride (TiSiN) layer, a tantalum silicon nitride (TaSiN) layer, or a tungsten silicon nitride (WSiN) layer.

An upper surface of the interlayer insulating layer 102 is exposed by planarizing the lower metal layer and the diffusion barrier layer. This planarization forms the first diffusion barrier layer pattern 104a covering the inner surfaces of the lower metal interconnection trench region 102a and the lower metal interconnection 106a surrounded by the first diffusion barrier layer pattern 104a. In addition, the second diffusion barrier layer pattern 104b covering the inner surfaces of the lower metal electrode trench region 102b and the lower metal electrode 106b surrounded by the second diffusion barrier layer pattern 104b are formed.

Figure 2B:
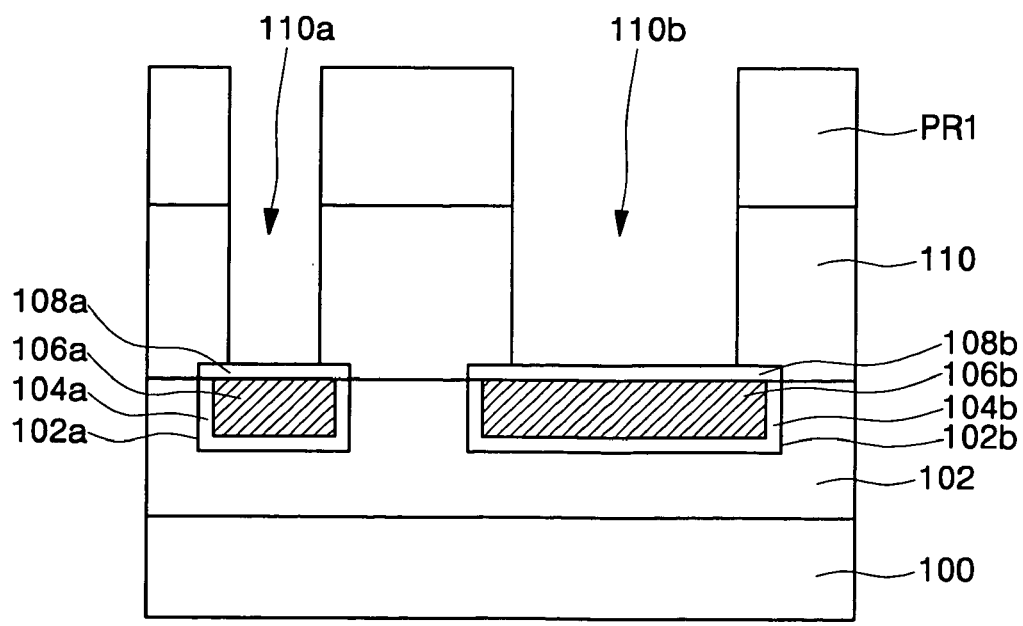

Referring to FIG. 2B, the intermetal dielectric layer 110 is formed on the semiconductor substrate 100 having the lower metal interconnection 106a and the lower metal electrode 106b. In addition, prior to forming the intermetal dielectric layer 110, an optional process using a selective metal deposition method may be performed to form the first and second capping layers 108a and 108b on the lower metal interconnection 106a and the lower metal electrode 106b, respectively. The first and second capping layers 108a and 108b are passivation layers for preventing the upper surfaces of the lower metal interconnection 106a and the lower metal electrode 106b from being oxidized by a subsequent photoresist ashing process. Each of the first and second capping layers 108a and 108b may be a tungsten layer deposited by a chemical deposition method, a cobalt tungsten phosphide (CoWP) layer deposited by an electroless plating method, or a cobalt tungsten boron (CoWB) layer deposited by an electroless plating method.

A first photoresist pattern PR1 having openings is then formed on the intermetal dielectric layer 110 formed over the lower metal interconnection 106a and the lower metal electrode 106b. The intermetal dielectric layer 110 is patterned by photolithography and etching processes using the first photoresist pattern PR1 to form the via hole 110a and the capacitor trench region 110b to expose the lower metal interconnection 106a and the lower metal electrode 106b, respectively. As discussed above, if the first and second capping layers 108a and 108b are present, the via hole 110a and the capacitor trench region 110b expose the first and second capping layers 108a and 108b, respectively.

Figure 2C:
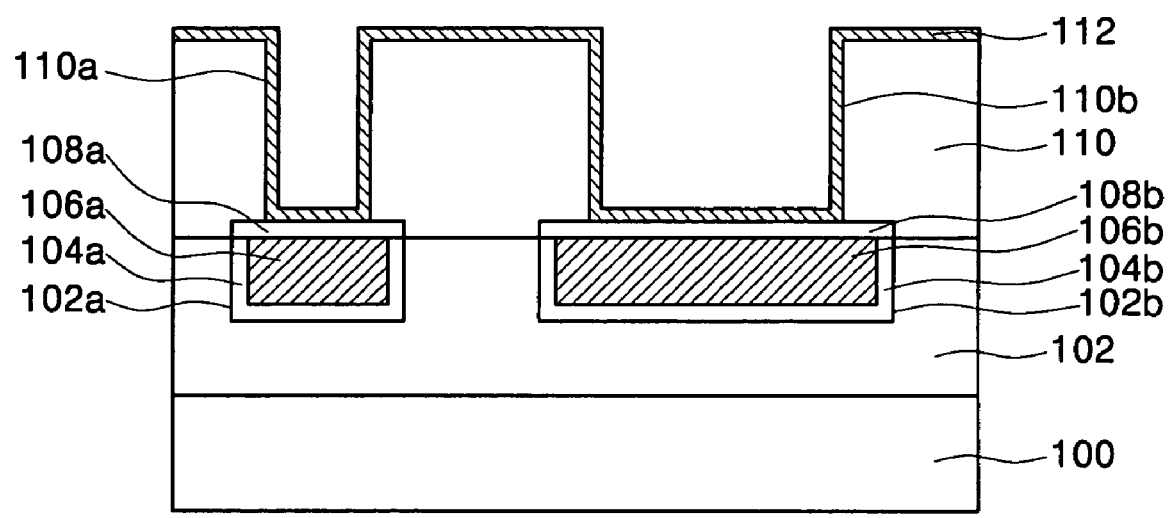

Referring to FIG. 2C, the first photoresist pattern PR1 is then removed. The first photoresist pattern PR1 may be removed by an ashing process or a wet etching process using an organic striper. Since a primary component of the first photoresist pattern PR1 is a polymer consisting of carbon (C), hydrogen (H) and oxygen (O) atoms, the first photoresist pattern PR1 is removed by formation of a volatile reaction product such as CO, $CO_2$, or the like, primarily by using an $O_2$ gas in the ashing process. Since the upper surfaces of the lower metal interconnection 106a and the lower metal electrode 106b may be oxidized due to the $O_2$ gas, it is preferable to remove the first photoresist pattern PR1 in a wet etching process using an organic striper when the first and second capping layers 108a and 108b of FIG. 2B have not been formed. An alkyl ammonium hydroxide-based organic compound may be used as the organic striper.

A thin metal layer 112 may then be conformably formed to cover inner surfaces of the via hole 110a, inner surfaces of the capacitor trench region 110b, and an upper surface of the intermetal dielectric layer 110. The thin metal layer 112 allows a lower electrode to extend to sidewalls of the capacitor trench region 110b, thereby obtaining the capacitance. The thin metal layer 112 may be formed of a titanium (Ti) layer, a tantalum (Ta) layer, or a tungsten (W) layer. Alternatively, the thin metal layer 112 may be formed of a nitride layer including one selected from the group consisting of the titanium (Ti) layer, the tantalum (Ta) layer, and the tungsten (W) layer, e.g., a titanium nitride (TiN) layer, a tantalum nitride (TaN) layer, or a tungsten nitride (TaN) layer. As a further alternative, the thin metal layer may be formed of a three-member nitride layer containing titanium (Ti), tantalum (Ta) or tungsten (W), e.g., a titanium silicon nitride (TiSiN) layer, a tantalum silicon nitride (TaSiN) layer, or a tungsten silicon nitride (WSiN) layer.

Figure 2D:
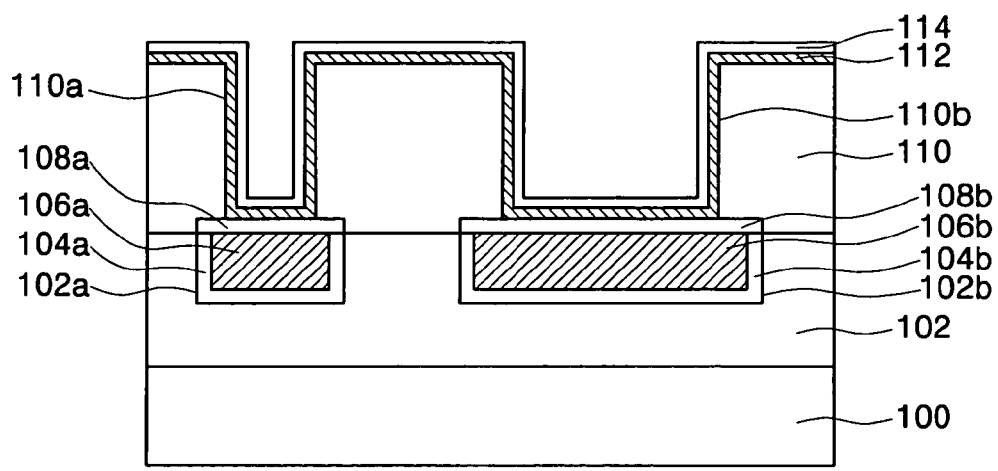

Referring to FIG. 2D, the dielectric layer 114 may then be conformably formed to cover the thin metal layer 112. The dielectric layer 114 may be formed of a silicon nitride (SiN) layer or a combination layer of a silicon nitride (SiN) layer and a silicon oxide ($SiO_2$) layer. When the dielectric layer 114 is formed of the combination film of the silicon nitride (SiN) layer and the silicon oxide ($SiO_2$) layer, it is preferable to form the silicon nitride (SiN) layer in a lower portion to prevent the upper surfaces of the lower metal interconnection 106a and the lower metal electrode 106b from being oxidized. Alternatively, the dielectric layer 114 may be formed of one selected from the group consisting of an aluminum oxide (AlO) layer, a hafnium oxide (HfO) layer, a tantalum oxide (TaO) layer, a lanthanum oxide (LaO) layer, an ST layer, a BST layer, a PZT layer, and a zirconium oxide (ZrO) layer. As a further alternative, the dielectric layer 114 may be formed of a nitride layer including one selected from the above-described layers, or a multi-layer of two or more selected from the above-described layers.

Figure 2E:
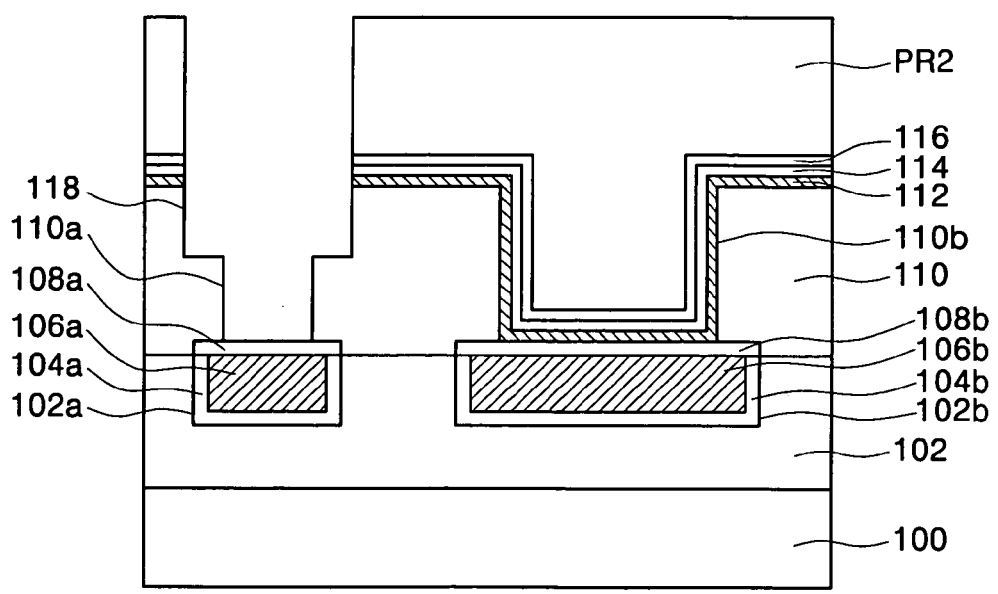

Referring to FIG. 2E, a sacrificial oxide layer 116 may then be conformably formed to cover the dielectric layer 114. The sacrificial oxide layer 116 may be formed of a material having large etch selectivity with respect to the dielectric layer 114, e.g., a silicon oxide ($SiO_2$) layer. The sacrificial oxide layer 116 is intended to prevent the dielectric layer 112 from being damaged during removal of a subsequently formed photoresist material.

A second photoresist pattern PR2 is then formed to have an opening crossing over the via hole 110a. The sacrificial oxide layer 116, the dielectric layer 114, and the thin metal layer 112 are then sequentially etched using the second photoresist pattern PR2 as an etch mask. Thereafter, the intermetal dielectric layer 110 exposed by the etching process is etched to a predetermined depth. As a result of this etching, an upper metal interconnection groove 118 crossing over the via hole 110a is formed in the intermetal dielectric layer 110. The upper metal interconnection groove 118 may be formed by simultaneously etching the sacrificial oxide layer 116, the dielectric layer 114, the thin metal layer 112, and the intermetal dielectric layer 110.

Figure 2F:
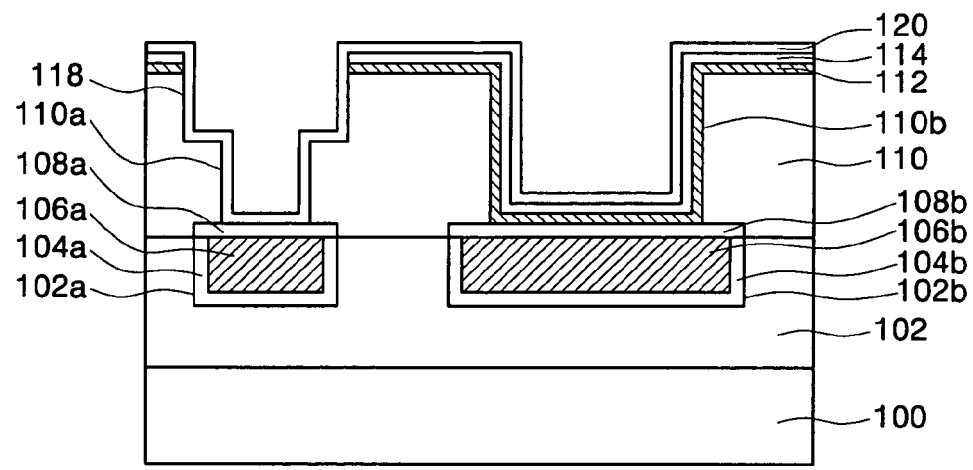

Referring to FIG. 2F, the second photoresist pattern PR2 used in the previous etching process is then removed. Removal of the second photoresist pattern PR2 may be accomplished in a manner substantially identical to removal of the first photoresist pattern PR1, as described above.

Additionally, the sacrificial oxide layer 114 formed to protect the dielectric layer 112 may be removed. The sacrificial oxide layer 116 may be removed by an etchant having high etch selectivity with respect to the dielectric layer 112. For example, the sacrificial oxide layer 116 may be removed by a hydrofluoric acid (HF) solution.

A diffusion barrier layer 120 may then be conformably formed on the entire surface of the semiconductor substrate 100 where the metal interconnection groove 118 is formed. The diffusion barrier layer 120 may be formed of one selected from the group consisting of a titanium (Ti) layer, a tantalum (Ta) layer, and a tungsten (W) layer. Alternatively, the diffusion barrier layer 120 may be formed of a nitride layer including one selected from the titanium (Ti) layer, the tantalum (Ta) layer, and the tungsten (W) layer, e.g., a titanium nitride (TiN) layer, a tantalum nitride (TaN) layer, or a tungsten nitride (WN) layer. As a further alternative, the diffusion barrier layer 120 may be formed of a three-member nitride layer containing titanium (Ti), tantalum (Ta) or tungsten (W), e.g., a titanium silicon nitride (TiSiN) layer, a tantalum silicon nitride (TaSiN) layer, or a tungsten silicon nitride (WSiN) layer.

Figure 2G:
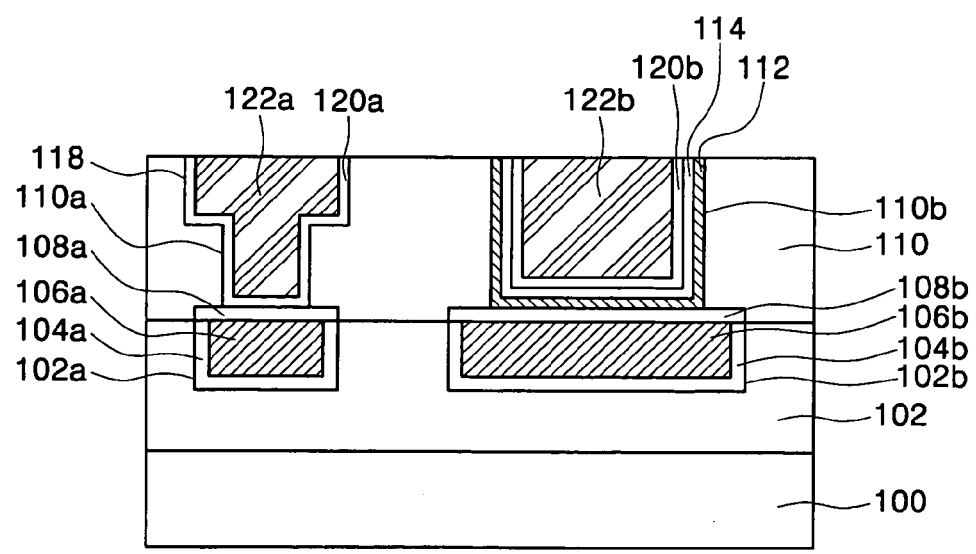

Referring to FIG. 2G, an upper metal layer is formed to fill the metal interconnection groove 118, the via hole 110a and the capacitor trench region 110b. The upper metal layer may be formed of a highly reliable metal layer, e.g., a copper layer. The copper layer may be formed by a chemical vapor deposition (CVD) method, an electroplating method, or an electroless plating method.

The diffusion barrier layer 120, the dielectric layer 114, the thin metal layer 112 and the upper metal layer are then planarized to expose the upper surface of the intermetal dielectric layer 110. This planarization forms the third diffusion barrier layer pattern 120a covering inner surfaces of the metal interconnection groove 118 and the via hole 110a, and the upper metal interconnection 122a surrounded by the third diffusion barrier layer pattern 120a. In addition, the fourth diffusion barrier layer 120b covering the inner surfaces of the dielectric layer 112 and the upper metal electrode 122b surrounded by the fourth diffusion barrier layer pattern 120b are formed. A lower electrode of the MIM capacitor is consist of the planarized metal layer 112, the second capping layer 108b and the lower metal electrode 106b.

According to the MIM capacitor and method of fabricating the same of the present invention, it is possible to simplify the photolithography process and reduce fabrication costs by simultaneously forming the upper metal interconnection and the upper electrode using a damascene method. In addition, even though a subsequent process for removing a photoresist is performed by an ashing process, the metal interconnection is not oxidized due to the presence of the capping layers, which act as oxidation barrier layers, on the lower copper interconnection and the lower metal electrode. In addition, it is possible to further obtain capacitance at sides by additionally forming a thin metal layer in the capacitor region before forming the dielectric layer to extend the lower electrode to sidewalls of the capacitor trench region.

According to the present invention, it is possible to reduce fabrication costs by reducing the number of required photolithography processes as compared to conventional fabrication.

Further, it is possible to improve the reliability of the device by preventing oxidation of the lower metal interconnection during removal of a photoresist using an ashing method.

In addition, it is possible to increase the capacitance of the capacitor by extending the lower electrode to sides of the upper electrode.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A metal-insulator-metal (MIM) capacitor, comprising:
   an interlayer insulating layer on a semiconductor substrate;
   a lower metal interconnection and a lower metal electrode in the interlayer insulating layer and spaced apart from each other;
   a first capping layer on the lower metal interconnection and a second capping layer on the lower metal electrode;
   a monolithic intermetal dielectric layer covering the lower metal interconnection, the lower metal electrode, the first and second capping layers, and the interlayer insulating layer;
   a via hole and an upper metal interconnection groove both disposed in the monolithic intermetal dielectric layer, wherein:
      the via hole penetrates a lower surface of the monolithic intermetal dielectric layer to expose the first capping layer on the lower metal interconnection, and
      the upper metal interconnection groove penetrates an upper surface of the monolithic intermetal dielectric layer and crosses over the via hole, such that an interface of the upper metal interconnection groove with the via hole is within the monolithic intermetal dielectric layer;
   at least one capacitor trench region extending through the monolithic intermetal dielectric layer, the at least one capacitor trench region exposing the second capping layer on the lower metal electrode;
   an upper metal interconnection filling the upper metal interconnection groove, the upper metal interconnection being electrically connected to the lower metal interconnection through the via hole;
   a dielectric layer covering inner surfaces of the at least one capacitor trench region; and
   an upper metal electrode surrounded by the dielectric layer to fill the at least one capacitor trench region.

2. The capacitor as claimed in claim 1, further comprising a diffusion barrier layer covering inner surfaces of the interlayer insulating layer and surrounding the lower metal electrode and the lower metal interconnection.

3. The capacitor as claimed in claim 2, wherein the diffusion barrier layer is formed of one selected from the group consisting of Ti, Ta, W, TiN, TaN, WN, TiSiN, TaSiN, and WSiN.

4. The capacitor as claimed in claim 1, further comprising a thin metal layer covering inner surfaces of the at least one capacitor trench region and surrounding the dielectric layer.

5. The capacitor as claimed in claim 1, wherein each of the first and second capping layers is formed of one selected from the group consisting of a tungsten layer, a cobalt tungsten phosphide layer, and a cobalt tungsten boron layer.

6. The capacitor as claimed in claim 1, further comprising a diffusion barrier layer covering inner surfaces of the dielectric layer, the via hole, and the metal interconnection groove and surrounding the upper metal interconnection and the upper metal electrode.

7. The capacitor as claimed in claim 6, wherein the diffusion barrier layer is formed of one selected from the group consisting of Ti, Ta, W, TiN, TaN, WN, TiSiN, TaSiN, and WSiN.

8. A metal-insulator-metal (MIM) capacitor, comprising:
   an interlayer insulating layer on a semiconductor substrate;
   a lower metal interconnection and a lower metal electrode in the interlayer insulating layer and spaced apart from each other;
   a monolithic intermetal dielectric layer covering the lower metal interconnection, the lower metal electrode, and the interlayer insulating layer;
   a via hole and an upper metal interconnection groove both disposed in the monolithic intermetal dielectric layer, wherein:
      the via hole penetrates a lower surface of the monolithic intermetal dielectric layer to expose the lower metal interconnection, and
      the upper metal interconnection groove penetrates an upper surface of the monolithic intermetal dielectric layer and crosses over the via hole, such that an interface of the upper metal interconnection groove with the via hole is within the monolithic intermetal dielectric layer;
   at least one capacitor trench region extending through the monolithic intermetal dielectric layer, the at least one capacitor trench region exposing the lower metal electrode;
   an upper metal interconnection filling the upper metal interconnection groove, the upper metal interconnection being electrically connected to the lower metal interconnection through the via hole;
   a thin metal layer covering inner surfaces of the at least one capacitor trench region;
   a dielectric layer covering inner surfaces of the thin metal layer; and
   an upper metal electrode surrounded by the dielectric layer to fill the at least one capacitor trench region.

9. The capacitor as claimed in claim 8, further comprising a diffusion barrier layer covering inner surfaces of the interlayer insulating layer and surrounding the lower metal electrode and the lower metal interconnection.

10. The capacitor as claimed in claim 9, wherein the diffusion barrier layer is formed of one selected from the group consisting of Ti, Ta, W, TiN, TaN, WN, TiSiN, TaSiN, and WSiN.

11. The capacitor as claimed in claim 8, wherein the thin metal layer is formed of one selected from the group consisting of Ti, Ta, W, TiN, TaN, WN, TiSiN, TaSiN, and WSiN.

12. The capacitor as claimed in claim 8, further comprising a diffusion barrier layer covering inner surfaces of the dielectric layer, the via hole, and the metal interconnection groove and surrounding the upper metal interconnection and the upper metal electrode.

13. The capacitor as claimed in claim 12, wherein the diffusion barrier layer is formed of one selected from the group consisting of Ti, Ta, W, TiN, TaN, WN, TiSiN, TaSiN, and WSiN.

14. The capacitor as claimed in claim 4, wherein the thin metal layer covers a bottom surface and side surfaces of the at least one capacitor trench region, the thin metal layer being electrically connected to the lower metal electrode and being covered by the dielectric layer such that the thin metal layer is between the monolithic intermetal dielectric layer and the dielectric layer along the bottom and side surfaces.

15. A semiconductor device having a capacitor and an interconnect disposed adjacent to one another on a substrate, the device comprising:
   a first insulating layer on a semiconductor substrate;
   a lower interconnection disposed in a first interconnection trench in the first insulating layer, and a lower electrode disposed in a first electrode trench in the first insulating layer, the lower interconnection and the lower electrode being a same material and having upper surfaces that are coplanar;
   a second insulating layer on the first insulating layer;
   a conductive plug disposed in a via in the second insulating layer, an upper interconnection disposed in a second interconnection trench in the second insulating layer, wherein an interface of the second interconnection trench with the via is within the second insulating layer, and an upper electrode disposed in a second electrode trench in the second insulating layer, the upper interconnection and the upper electrode being a same material and having upper surfaces that are coplanar; and
   a capacitive structure disposed adjacent to the upper electrode, the capacitive structure including:
      a conductive member disposed along a bottom surface and side surfaces of the second electrode trench, the conductive member being electrically connected to the lower electrode; and
      a capacitor dielectric disposed along the bottom surface and side surfaces of the second electrode trench, the capacitor dielectric being disposed on the conductive member such that the capacitor dielectric is between the conductive member and the upper electrode.

16. The semiconductor device as claimed in claim 15, wherein the conductive plug and the upper interconnection are a monolithic structure in the second insulating layer.

17. The semiconductor device as claimed in claim 16, wherein the conductive plug, the upper interconnection and the upper electrode are a copper-based material.

18. The semiconductor device as claimed in claim 15, wherein the lower interconnection and the lower electrode are a copper-based material.

19. The semiconductor device as claimed in claim 15, wherein the conductive member has an uppermost extent that is coplanar with the upper surface of the upper electrode.

20. The semiconductor device as claimed in claim 19, wherein the capacitor dielectric has an uppermost extent that is coplanar with the upper surface of the upper electrode.

21. The semiconductor device as claimed in claim 15, further comprising:
   a first capping layer covering the upper surface of the lower interconnection and a second capping layer covering the upper surface of the lower electrode, the first and second capping layers having lower surfaces that are coplanar and upper surfaces that are coplanar.

22. The semiconductor device as claimed in claim 21, wherein the first and second capping layers are a same conductive material.

* * * * *